US011682596B2

(12) United States Patent
Hinata et al.

(10) Patent No.: US 11,682,596 B2
(45) Date of Patent: Jun. 20, 2023

(54) POWER SEMICONDUCTOR MODULE

(71) Applicant: Fuji Electric Co., Ltd., Kanagawa (JP)

(72) Inventors: Yuichiro Hinata, Nagano (JP); Ryotaro Tsuruoka, Nagano (JP)

(73) Assignee: Fuji Electric Co., Ltd., Kanagawa (JP)

( * ) Notice: Subject to any disclaimer, the term of this patent is extended or adjusted under 35 U.S.C. 154(b) by 198 days.

(21) Appl. No.: 17/064,521

(22) Filed: Oct. 6, 2020

(65) Prior Publication Data

US 2021/0151356 A1  May 20, 2021

(30) Foreign Application Priority Data

Nov. 19, 2019 (JP) ................. 2019-209019

(51) Int. Cl.

| | |
|---|---|
| *H01L 23/498* | (2006.01) |
| *H01L 23/057* | (2006.01) |
| *H01R 13/40* | (2006.01) |
| *H01R 12/58* | (2011.01) |
| *H05K 5/00* | (2006.01) |

(Continued)

(52) U.S. Cl.
CPC ...... *H01L 23/49811* (2013.01); *H01L 23/057* (2013.01); *H01L 23/12* (2013.01); *H01L 23/3121* (2013.01); *H01L 23/49827* (2013.01); *H01L 23/49838* (2013.01);
(Continued)

(58) Field of Classification Search
CPC . H01L 23/28; H01L 23/3107; H01L 23/3121; H01L 23/50; H01L 23/481; H01L 23/482; H01L 23/49; H01L 23/498; H01L 23/49811; H01L 23/49827; H01L 23/49833; H01L 23/49838; H01L 23/5283; H01L 23/5286; H01L 23/5383; H01L 23/5384; H01L 23/5386; H01L 25/073; H01L 23/057; H01L 23/12; H01R 12/58; H01R 13/40; H05K 1/181; H05K 5/0069

See application file for complete search history.

(56) References Cited

U.S. PATENT DOCUMENTS 10,957,630 B2 * 3/2021 Umeda ............. H01L 23/49811
2017/0077068 A1 * 3/2017 Horio ....................... H01L 25/18
(Continued)

FOREIGN PATENT DOCUMENTS

JP H10-241760 A 9/1998
JP 2005-56805 A 3/2005
(Continued)

*Primary Examiner* — Eduardo A Rodela
(74) *Attorney, Agent, or Firm* — Chen Yoshimura LLP

(57) ABSTRACT

A power semiconductor module includes an insulating circuit substrate; a printed circuit board disposed over the insulating circuit substrate; and a plurality of terminals each having a rod-shaped portion and including a first protrusion and a second protrusion each protruding laterally form a side face of the rod-shaped portion; wherein at least one of the plurality of terminals is inserted to one of the through-holes of the printed circuit board and is locked to the one of the through-holes via the first protrusion, and wherein at least another one of the plurality of terminals is inserted to another one of the through-holes of the printed circuit board and is locked to said another one of the through-holes via the second protrusion, and an end of the at least another one of the plurality of terminals is electrically connected to a conductive plate on the insulating circuit substrate.

8 Claims, 9 Drawing Sheets

(51) Int. Cl.
*H01L 23/31* (2006.01)
*H05K 1/18* (2006.01)
*H01L 23/12* (2006.01)

(52) U.S. Cl.
CPC ............. *H01R 12/58* (2013.01); *H01R 13/40* (2013.01); *H05K 1/181* (2013.01); *H05K 5/0069* (2013.01)

(56) References Cited

U.S. PATENT DOCUMENTS

2017/0365547 A1* 12/2017 Nakamura .......... H01L 23/3735
2021/0111105 A1* 4/2021 Kim ...................... H02M 7/003

FOREIGN PATENT DOCUMENTS

| JP | 2005-123048 A | 5/2005 |
| JP | 2013-125804 A | 6/2013 |

* cited by examiner

Terminal Diameter A < Protrusion Dimension D < Protrusion Dimension E

Terminal Diameter A < Protrusion Dimension B
Terminal Diameter A < Protrusion Dimension C

POWER SEMICONDUCTOR MODULE

BACKGROUND OF THE INVENTION

Technical Field

The present invention relates to a power semiconductor module.

Background Art

In inverter devices, industrial robots, etc., a power semiconductor module equipped with a power semiconductor element is used independently of the main device. The power semiconductor module includes semiconductor chips connected, via solder, to electric wiring portions provided on a surface of an insulating substrate and a printed circuit board to which external electrodes connecting to electric wirings having different potentials, and is structured such that electric passages are secured by connecting the electric wirings on the insulating substrate to the external electrodes by a bonding member such as solder or the like.

In such a power semiconductor module, the printed circuit board and the external terminals are connected by press-fitting the external terminals onto respective through-holes of the printed circuit board so as to place the external terminals connected to the printed circuit board on the insulating substrate. Then, in order to bond the external terminals connected to the printed circuit board with the insulating substrate via solder or the like, a heat treatment at 200° C. up to about 350° C. is performed. At that time, before the solder is heated and cooled for solidification, a sufficient coupling force must be secured in order to vertically support the printed circuit board and the external terminals. For that purpose, the external terminals have press-fit parts for press-fitting into the through-holes (see, for example, Patent Documents 1 and 2). Further, the external terminals may have protrusions that are larger than the outer shape of the terminals such that the diameter of the protrusion parts is larger than the inner diameter of the through-hole (see, for example, Patent Documents 3 and 4).

In the above-mentioned power semiconductor module, a plurality of external terminals protrude from the case, and the length of the protruded portions varies depending on the intended use.

In such a power semiconductor module, there may be situations where, after the module has been used, a change in the intended use or the like may occur, and as a result, there occurs a need for changing the length of the protruded portions of the external terminals depending on the positions of the external terminals. However, in the above-mentioned power semiconductor module, because the lengths of the protruded portions of the external terminals are fixed in advance at their positions, and accordingly, it is not possible to flexibly deal with such a need. Patent Documents 1-4 do not address this problem.

RELATED ART DOCUMENT

Patent Document

Patent Document 1: Japanese Patent Application Laid-Open Publication No. 2005-56805
Patent Document 2: Japanese Patent Application Laid-Open Publication No. 2005-123048
Patent Document 3: Japanese Patent Application Laid-Open Publication No. H10-241760
Patent Document 4: Japanese Patent Application Laid-Open Publication No. 2013-125804

SUMMARY OF THE INVENTION

The present invention is devised in view of the foregoing and aims at providing a semiconductor module that can flexibility cope with the case where the lengths of terminals protruding to the outside of the case need to be changed depending on their positions.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a power semiconductor module, comprising: an insulating substrate having a conductive plate that mounts a semiconductor chip thereon; a printed circuit board having a plurality of through-holes, the printed circuit board being placed above the insulating circuit substrate so as to face a surface of the insulating circuit substrate on which the semiconductor chip is mounted; a plurality of terminals, each of the plurality of terminals having a rod-shaped portion, and including a first protrusion and a second protrusion each protruding laterally form a side face of the rod-shaped portion, the first protrusion being positioned closer to an end of the terminal than the second protrusion; and a sealing part sealing the insulating circuit substrate, the printed circuit board, and the plurality of terminals, wherein at least one of the plurality of terminals is inserted to one of the through-holes of the printed circuit board and is locked to the one of the through-holes via the first protrusion, and wherein at least another one of the plurality of terminals is inserted to another one of the through-holes of the printed circuit board and is locked to said another one of the through-holes via the second protrusion, and the end of the at least another one of the plurality of terminals is electrically connected to the conductive plate on the insulating circuit substrate.

According to the present invention, it is possible to provide a power semiconductor module that can flexibly cope with the case where it is desirable to change the lengths of the terminals protruding outside the case depending on their positions.

It is to be understood that both the foregoing general description and the following detailed description are exemplary and explanatory, and are intended to provide further explanation of the invention as claimed.

DETAILED DESCRIPTION OF EMBODIMENTS

Figure 1:
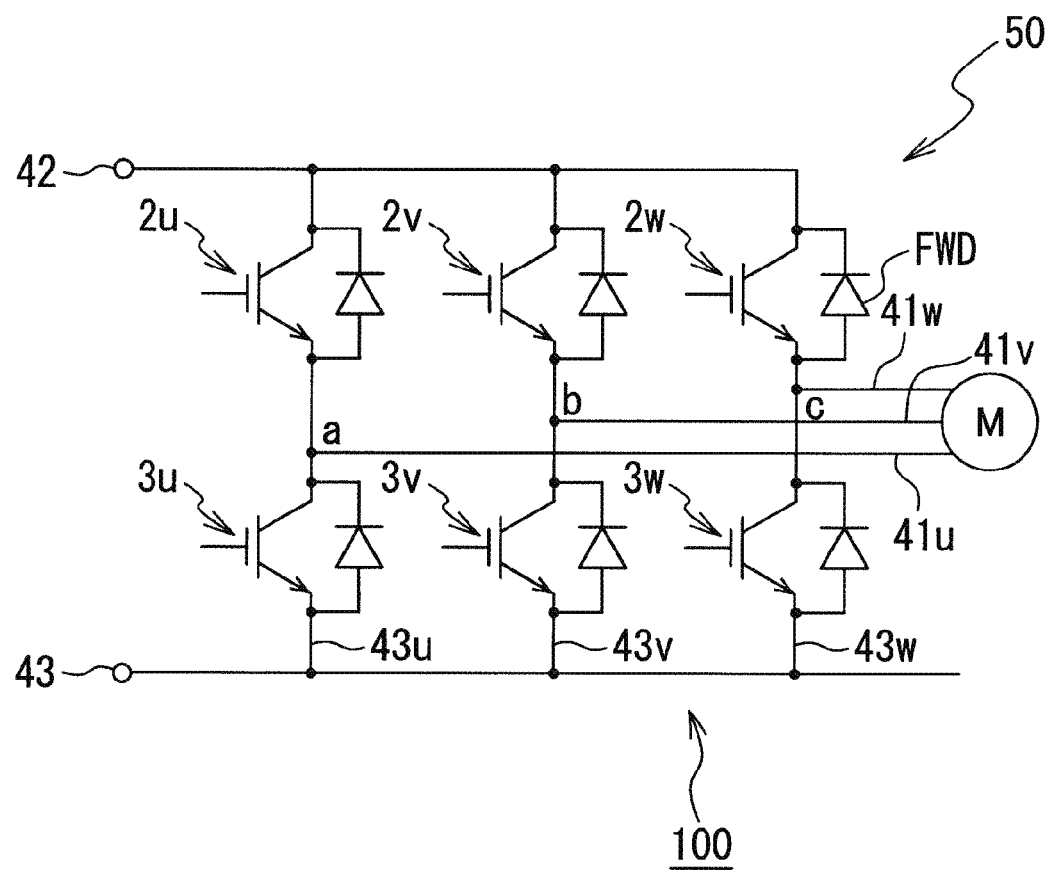
FIG. 1 is a circuit diagram of a configuration example of a power semiconductor module according to Embodiment 1.

Embodiments of the present invention will be described. In the following descriptions of the drawings, the same or similar elements are assigned the same or similar reference characters/numerals, and their duplicate explanations will be omitted. Further, the drawings are only schematical illustrations, and relationships between the thicknesses and the planar dimensions, the ratios between the thicknesses of each apparatus/device and each member/part, and the like may differ from actual dimensions or ratios. Therefore, specific dimensions, lengths or their ratios should be understood with reference to the following descriptions. Moreover, the drawings may contain portions in which the relationships and ratios among various dimensions may differ among the drawings.

In the descriptions of the drawings, directions may be indicated with reference to the X-axis direction, the Y-axis direction, and/or the Z-axis direction. The X-axis, the Y-axis, and the Z-axis are orthogonal to each other.

Further, in the descriptions below, there are cases where the positive Z-axis direction is referred to as "up," and the negative Z-axis direction is referred to as "down." However, the directions of "up" and "down" are not restricted to the vertical directions relative to the ground. That is, the "up" and "down" directions are not limited by the direction of gravity. The expressions of "up" and "down" merely specify relative positional relationships between the layers and/or substrate for convenience, and do not limit the technical scope of the present invention. For example, it is needless to say that if the sheet of drawing is rotated by 180°, the "up" becomes "down" and "down" becomes "up."

Embodiment 1

Figure 2:
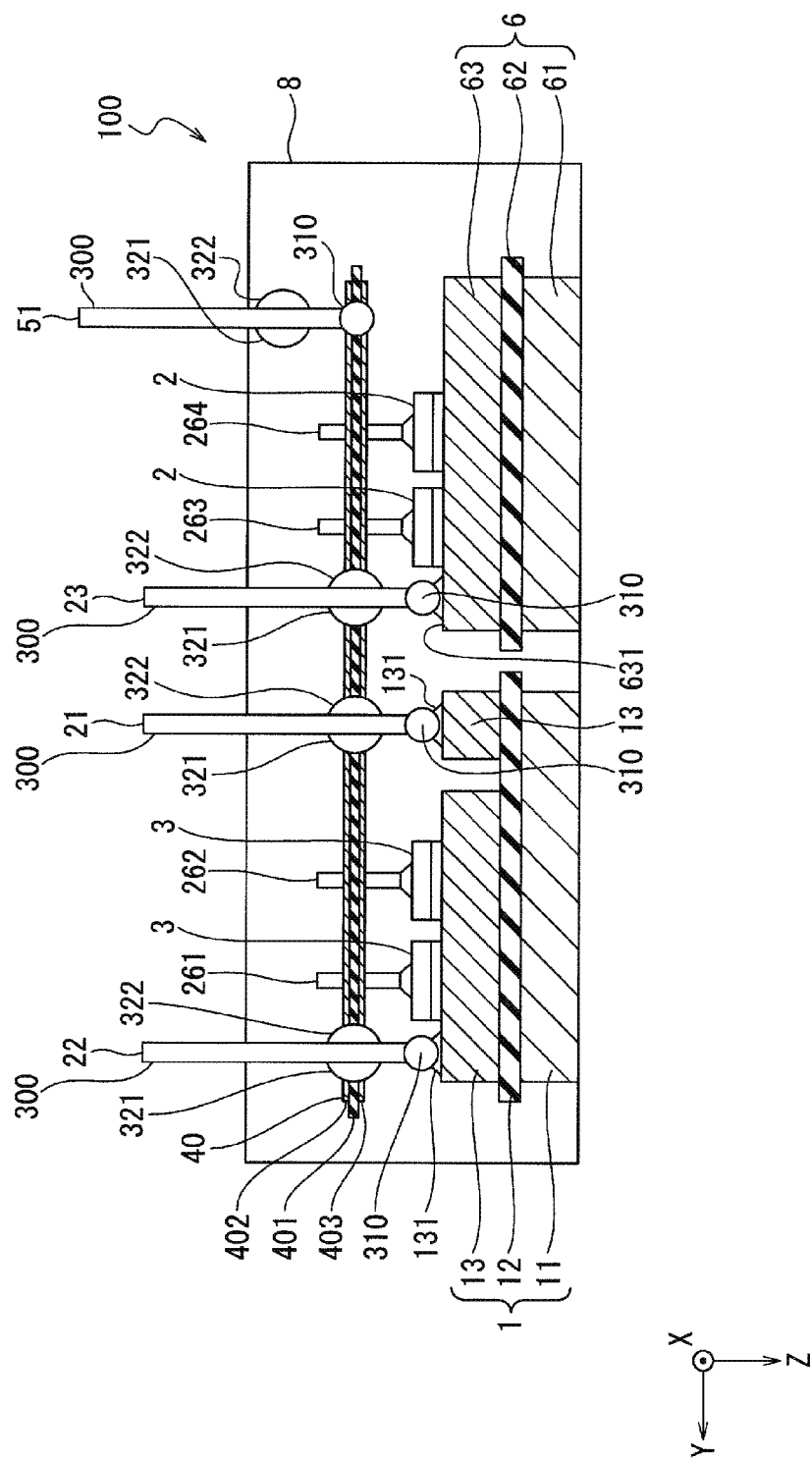
FIG. 2 is a cross-sectional view of a configuration example of the power semiconductor module according to Embodiment 1.

FIG. 1 shows a circuit diagram of a configuration example of a power semiconductor module 100 according to Embodiment 1 of the present invention. FIG. 2 is a cross-sectional view of a configuration example of the power semiconductor module of Embodiment 1. As shown in FIG. 1, the power semiconductor module 100 according to Embodiment 1 of the present invention includes a three-phase inverter circuit 50. The inverter circuit 50 includes a DC power source (not shown in the figure) a positive terminal (positive input terminal; P terminal) 42 that can be connected to a high voltage side of the DC power source, a negative terminal (negative input terminal; N terminal) 43, and three-phase output terminals 41*u*, 41*v*, and 41*w*. The output terminals 41*u*, 41*v*, and 41*w* are respectively connected, at connection points a, b, c, respectively, to three-phase circuits of U-phase, V-phase, and W-phase, which are connected to the positive terminal 42 and the negative terminal 43. The output terminals 41*u*, 41*v*, and 41*w* are connected to a load M, which may be a motor or the like.

The U-phase circuit is constructed of a U-phase upper arm and a U-phase lower arm. The U-phase upper arm includes a semiconductor chip 2*u*, and the U-shape lower arm includes a semiconductor chip 3*u*.

Similarly, the V-phase circuit is constructed of a V-phase upper arm and a V-phase lower arm. The V-phase upper arm includes a semiconductor chip 2*v*, and the V-shape lower arm includes a semiconductor chip 3*v*. The W-phase circuit is constructed of a W-phase upper arm and a W-phase lower arm. The W-phase upper arm includes a semiconductor chip 2*w*, and the W-shape lower arm includes a semiconductor chip 3*w*.

The semiconductor chips 2*u*, 2*v*, 2*w*, 3*u*, 3*v*, and 3*w* are chips each having a vertical switching element on a silicon substrate. The switching element may be a transistor, such as an insulating gate bipolar transistor (IGBT) or power MOSFET. The semiconductor chips 2 and 3 may be mounted on an insulating circuit substrate 1 together with a freewheel diode (FWD) that is antiparallelly connected thereto. The semiconductor chips 2 and 3 may be a reverse-conducting IGBT (RC-IGBT) having an IGBT and an FWD formed on a semiconductor substrate. The semiconductor chips 2 and 3 each include an upper surface electrode and a lower surface electrode. The upper surface electrode may be an emitter electrode, a source electrode, or an anode electrode. The lower surface electrode may be a collector electrode, a drain electrode or a cathode electrode. The semiconductor chips 2 and 3 may further include a gate electrode. The semiconductor substrate may be a wide-bandgap semiconductor substrate, such as a silicon carbide substrate or a gallium nitride substate.

Below, when there is no need to distinguish between the semiconductor chips 2*u*, 2*v*, and 2*w*, the semiconductor chips 2*u*, 2*v*, and 2*w* are collectively referred to as the semiconductor chips 2. When there is no need to distinguish between the semiconductor chips 3*u*, 3*v*, and 3*w*, the semiconductor chips 3*u*, 3*v*, and 3*w* are collectively referred to as the semiconductor chips 3. When there is no need to distinguish between the output terminals 41*u*, 41*v*, and 41*w*, the output terminals 41*u*, 41*v*, and 41*w* are referred to as the output terminals 41.

As shown in FIG. 2, the inverter circuit 50 includes an insulating circuit substrate 6 on which the semiconductor chips 2 are mounted and an insulating circuit substrate 1 on which the semiconductor chips 3 are mounted. The insulating circuit substrates 1 and 6 each have a front surface and a rear surface that is opposite to the front surface.

As shown in FIG. 2, the insulating circuit substrate 1 includes a metal plate 11, an insulating layer 12 provided on the metal plate 11, and a circuit layer 13 as a conductive plate provided on the insulating layer 12. The metal plate 11 is made of copper or a copper alloy, for example.

As shown in FIG. 2, the semiconductor chips 3 are arranged on an electrode portion 131 of the circuit layer 13. The rear surface of the semiconductor chip 3 is joined to the electrode portion 131 via solder. By this bonding, the circuit layer 13 is electrically connected to the lower surface electrode (collector electrode or drain electrode) located on the rear surface side of the semiconductor chip 3.

A printed circuit board 40 is arranged above the front surface of the semiconductor chip 3. The printed circuit board 40 is provided with a plurality of through holes penetrating the printed circuit board 40 in the Z-axis direction. The printed circuit board 40 has an insulating layer 401, a circuit layer 402 formed on the front surface of the insulating layer 401, and a circuit layer 403 formed on the back surface of the insulating layer 401. The plurality of through holes penetrate the insulating layer 401 and the two circuit layers 402 and 403, and the inner walls of the through holes are made of a conductive material that conductively connects the front and rear surfaces of the circuit layers 402 and 403.

The external terminal 21 is inserted into one through hole. The external terminal 21 has a rod-shaped portion 300 and a first protrusion 310 and second protrusions 321 and 322 (or collectively a second protrusion 321 to represent the whole structure of the second protrusions 321 and 322) protruding from the side surfaces of the rod-shaped portion 300. The protruding directions of the first protrusion 310 and the second protrusion(s) 321 and 322 along the directions (X-axis direction and Y-axis direction in FIG. 2) orthogonal to the extending direction of the rod-shaped portion 300 (Z-axis direction in FIG. 2) may be made mutually different by 90°, for example. The second protrusions 321 and 322 constitute two protruding portions, forming a horizontal single line shape, for example, in a cross section taken along the directions (X-axis direction and Y-axis direction in FIG. 2) orthogonal to the extending direction (Z-axis direction in FIG. 2) of the rod-shaped portion 300.

When the external terminal 21 is inserted into the through hole formed in the printed circuit board 40, the first protrusion 310 first engages with the through hole. Then, by further inserting the rod-shaped portion 300, the tops of the second protrusions 321 and 322 engage with the through hole, and the end of the external terminals 21 comes into contact with the electrode portions 131 of the circuit layer 13. The external terminal 21 is joined to the printed circuit board 40 via solder. The external terminal 21 is also joined to the electrode portion 131 of the circuit layer 13 via solder. By this bonding, the printed circuit board 40 is electrically connected to the electrode portion 131 of the circuit layer 13 via the external terminal 21.

The printed circuit board 40 and the external terminal 21 are provided in each of the U-phase, V-phase, and W-phase circuits. The insulating circuit substrates 1 and 6 are also provided in each of the U-phase, V-phase, and W-phase circuits.

The external terminal 22 is inserted into another through hole of the printed circuit board 40. The external terminal 22 also has the same configuration as the external terminal 21.

When the external terminal 22 is inserted into another through hole formed in the printed circuit board 40, the first protrusion 310 first engages with the through hole. Then, by being inserted further deeper, the tops of the second protrusions 321 and 322 engage with the through hole, and the end of the external terminals 22 comes into contact with the electrode portion 131 of the circuit layer 13. The external terminal 22 is joined to the printed circuit board 40 and the electrode portion 131 via solder. By this bonding, the printed circuit board 40 is electrically connected to the electrode portion 131 of the circuit layer 13 via the external terminal 22.

Further, terminals 261 and 262 are inserted into other through holes of the printed circuit board 40. The ends of the terminals 261 and 262 are connected to respective electrodes of the semiconductor chips 3.

On the other hand, the insulating circuit substrate 6 includes a metal plate 61, an insulating layer 62 provided on the metal plate 61, and a circuit layer 63 as a conductive material provided on the insulating layer 62. The metal plate 61 is made of, for example, copper or a copper alloy. As shown in FIG. 2, the printed circuit board 40 is arranged on the electrode portion 631 of the circuit layer 63. The external terminal 23 is inserted into another through hole of the printed circuit board 40. The external terminal 23 also has the same configuration as the external terminal 21.

When the external terminal 23 is inserted into the through hole formed in the printed circuit board 40, the tops of the second protrusions 321 and 322 engage with the through hole, and the end of the external terminal 23 comes into contact with the electrode portion 631 of the circuit layer 63. The external terminal 23 is joined to the printed circuit board 40 and the electrode portion 631 via solder. By this bonding, the printed circuit board 40 is electrically connected to the electrode portion 631 of the circuit layer 63 via the external terminal 23.

The terminals 263 and 264 are inserted into other through holes of the printed circuit board 40. The ends of the terminals 263 and 264 are connected to respective electrodes of the semiconductor chips 2.

Further, an external terminal 51 is inserted into yet another through hole of the printed circuit board 40. The external terminal 51 also has the same configuration as the external terminal 21.

When the external terminal 51 is inserted into the through hole formed in the printed circuit board 40, the top of the first protrusion 310 engages with the through hole. The external terminals 51 are joined to the printed circuit board 40 via solder.

Figure 3:
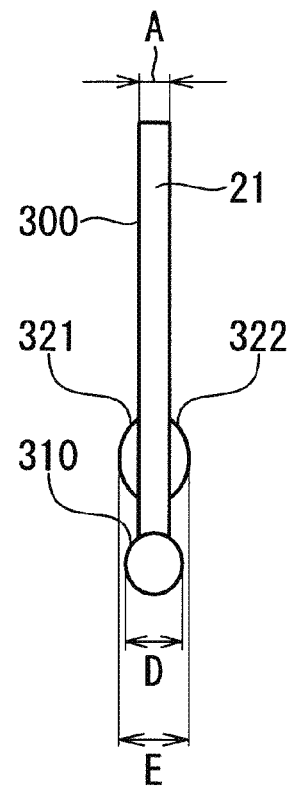
FIG. 3 shows the shape of protrusions in an external terminal of the power semiconductor module of Embodiment 1.

As shown in FIG. 3, the outermost diameter (dimension) of the second protrusions 321 and 322 (in FIG. 3, the outermost diameter/dimension of the second protrusions is indicated by E) of each of the external terminals 21, 22, 23 and 51 is larger than the outermost diameter (dimension) of the first protrusion 310 (the outermost diameter/dimension of the first protrusion is indicated by D in FIG. 3). The outermost diameter/dimension D of the first protrusion 310 and the outermost diameter/dimension E of the second protrusions 321 and 322 are larger than the diameter of the rod portion 300 (in FIG. 3, the diameter of the rod portion of the external terminal 21 is indicated by A).

The insulating circuit substrates 1 and 6, the printed circuit board 40, the external terminals 21, 22, 23 and 51, and the terminals 261, 262, 263 and 264 are sealed with a sealing resin 8.

Comparison Example

Next, the conventional power semiconductor module and the power semiconductor module 100 of Embodiment 1 of the present invention are compared. Regarding the conventional power semiconductor module, the same parts as those of the power semiconductor module of Embodiment 1 of the present invention will be denoted by the same reference numerals/characters and detailed descriptions thereof will be omitted.

Figure 4:
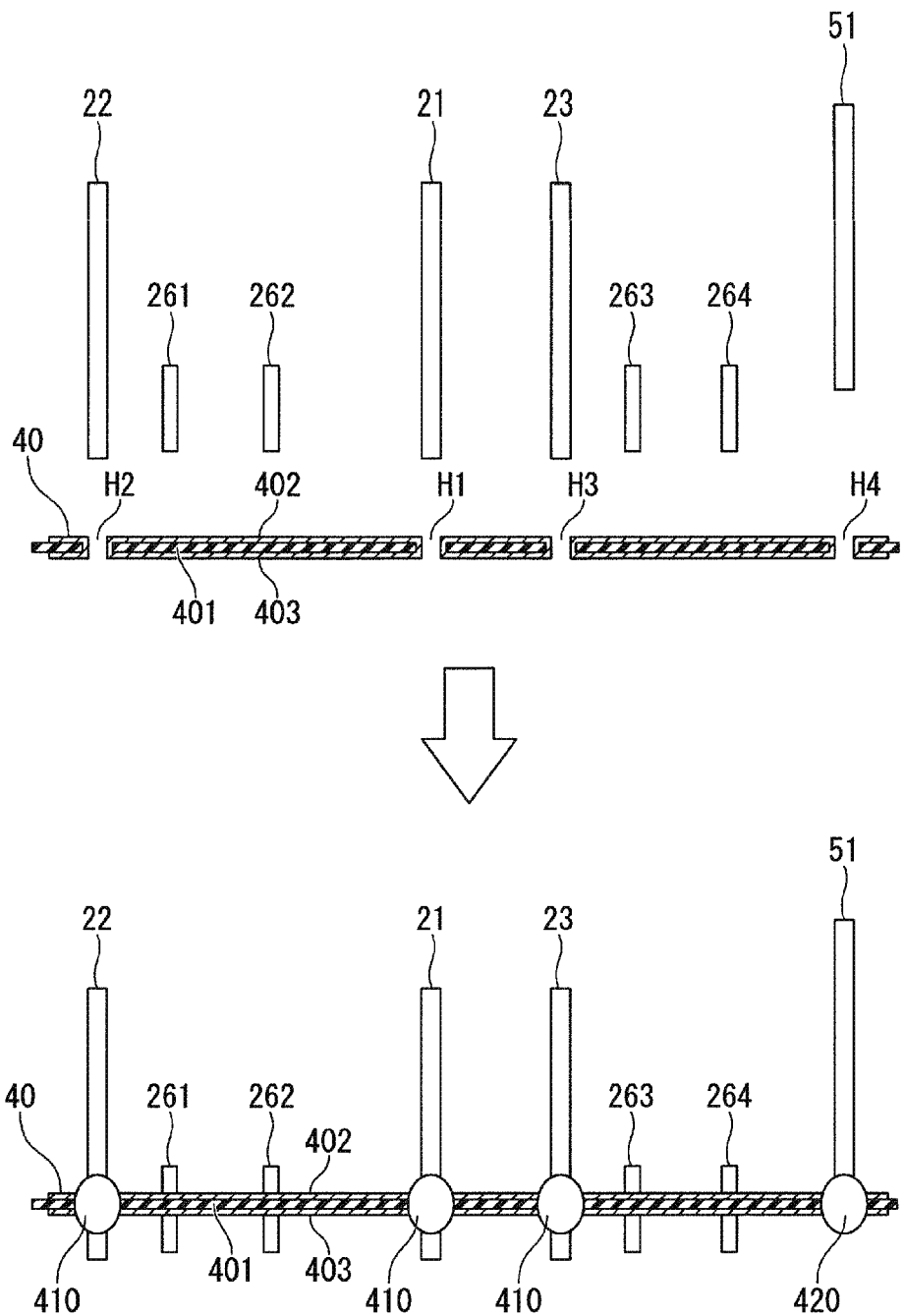
FIG. 4 shows an assembly procedure of a power semiconductor module of Comparison Example.
Figure 5:
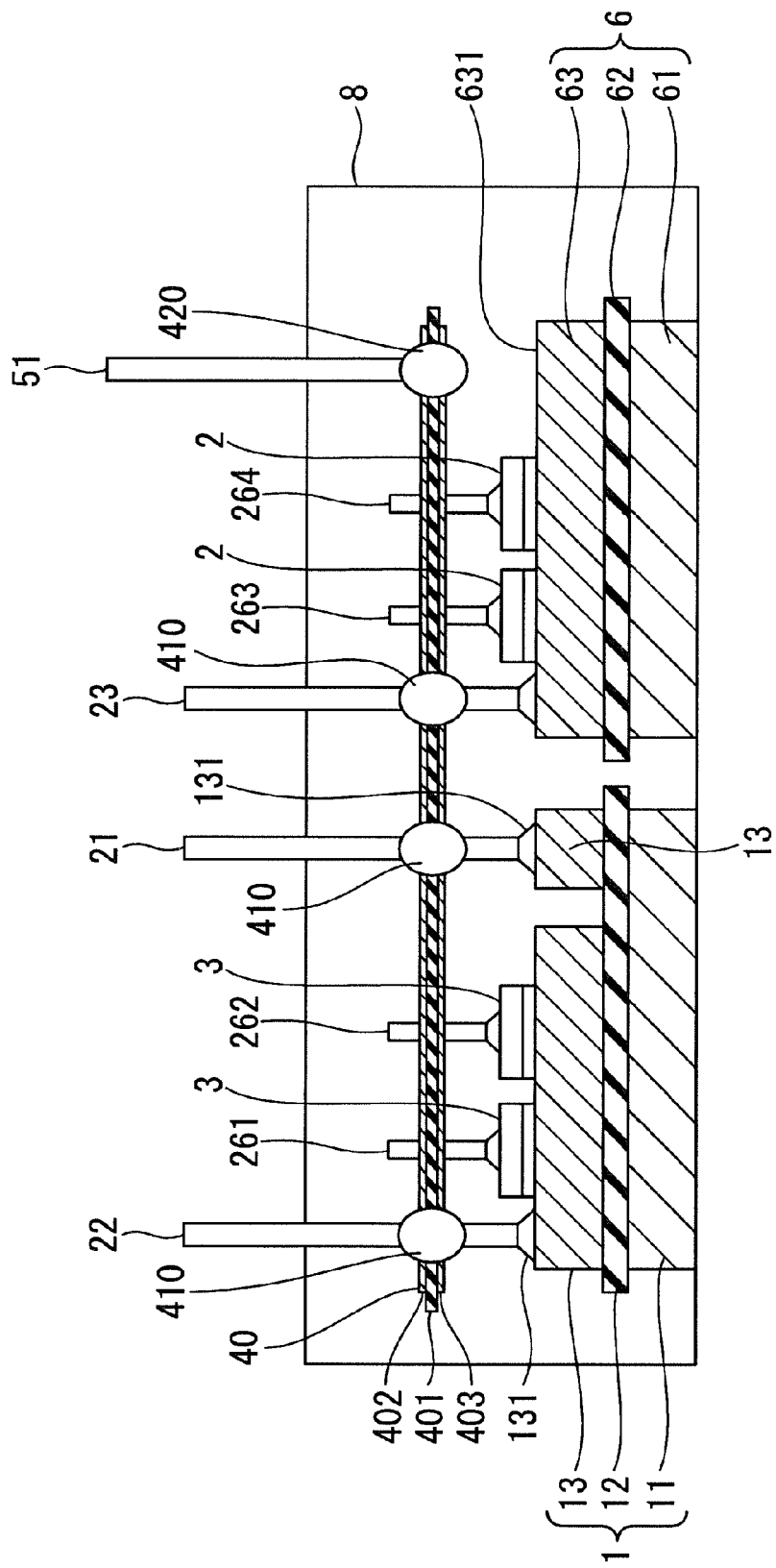
FIG. 5 is a cross-sectional view of a configuration example of the power semiconductor module of Comparison Example.

As shown in FIG. 4, in the conventional power semiconductor module, the external terminals 21, 22, 23, and 51 are press-fitted into the through holes H1, H2, H3, and H4 of the printed circuit board 40 so that the printed circuit board 40 and the external terminals are connected to each other. The external terminals 21, 22, 23, 51 connected to the printed circuit board 40 are then mounted on the insulating circuit substrates 1 and 6, as shown in FIG. 5. A convex protrusion 410 that is press-fitted in the through hole is provided in each of the external terminals 21, 22, and 23 in order to provide for a force for vertically supporting the printed circuit board 40 and the external terminals 21, 22, 23, and 51 until these external terminals are fixed via soldering and heating. Further, the external terminal 51 is provided with a protrusion 420 at a position that is different, in the vertical direction, from the position of the protrusions 410.

Figure 6:
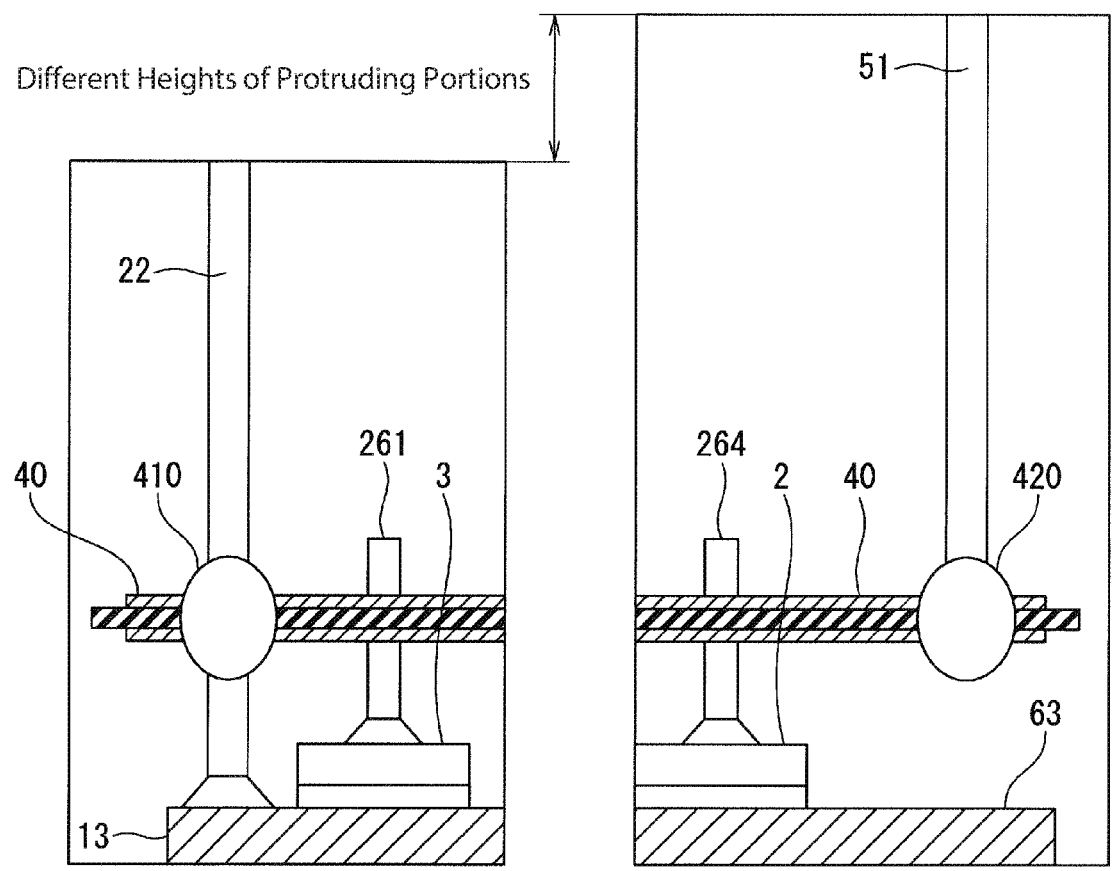
FIG. 6 is a figure for explaining that the lengths of the external terminals protruding from the sealing resin are different in the power semiconductor module of Comparison Example.
Figure 7:
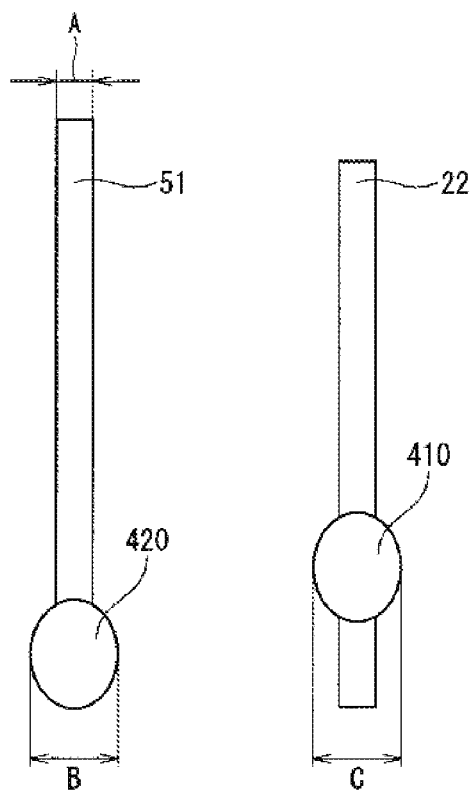
FIG. 7 shows two types of the external terminals in the power semiconductor module of Comparison Example.

In the conventional semiconductor module, as shown in FIG. 6, when it is desired to change the length of the external terminals 21, 22, 23, 51 protruding outside the sealing resin 8 depending on their positions, it is necessary to prepare two types of external terminals, such as the external terminal 51 having the protrusion 420 formed therein and the external terminal 22 having the protrusion 410 formed therein, as shown in FIG. 7. In this case, a different apparatus for inserting the terminal is required for each type of terminal, or in order to install the two types of terminal insertions with one apparatus, it is necessary to change the type of the external terminal each time the type of external terminal must be changed. This takes time and effort.

According to Embodiment 1 of the present invention, when it is desired to change the lengths of the external terminals 21, 22, 23, 51 protruding to the outside of the sealing resin 8 depending on their positions, this can be realized with one type of external terminals 21, 22, 23, and 51 provided with the first protrusion 310 and the second protrusions 321 and 322.

When it is desired to increase the length of the external terminal 21 protruding from the sealing resin 8 in the environment as described above, in the conventional power semiconductor module, the external terminal 21 needs to be removed from the printed circuit board 40 and be replaced with an external terminal having the protrusion 420. In contrast, in Embodiment 1 of the present invention, it is not necessary to remove the external terminal 21 from the printed circuit board 40, and all you have to do is melt the solder and change the second protrusions 321 and 322, which were locked to the though hole, to the first protrusion 310 for locking to the through hole.

Further, when it is desired to shorten the length of the external terminal 51 protruding from the sealing resin 8, in the conventional power semiconductor device, the external terminal 51 needs to be removed from the printed circuit board 40 and be replaced with the external terminal having the protrusion 410. In contrast, in Embodiment 1 of the present invention, it is not necessary to remove the external terminal 51 from the printed circuit board 40, and all you have to do is melt the solder and change the first protrusion 310, which was locked to the though hole, to the second protrusions 321 and 322 for locking to the through hole.

<Effects of Embodiment 1>

As described above, according to the above-described Embodiment 1, the external terminals 21, 22, 23, and 51 are provided with the first protrusions 310 and the second protrusions 321 and 322, which are protruding from the side surfaces of the rod-shaped portion 300, respectively. For example, the external terminal 51 is locked to the through hole of the printed circuit board 40 by the first protrusions 310, and the external terminal 21 is locked to the through hole by the second protrusions 321 and 322 to provide for differing terminal lengths outside of the sealing resin 8. Because of this structure, when it is desired to increase the length of the projecting portion of the external terminal 21 outside the sealing resin 8, the second projecting portions 321 and 322, which were locked to the through hole, merely need to be changed to the first projecting portion 310, and when it is desired to shorten the length of the projecting portion of the external terminal 51 outside the sealing resin 8, the first protruding portion 310, which was locked to the through hole, just needs to be changed to the second protruding portions 321 and 322. Therefore, there is no need to replace these terminals with a new terminal.

In addition, in Embodiment 1, in each of the external terminals 21, 22, 23, and 51, the protruding directions of the first protrusion 310 and the second protrusions 321 and 322 are different from each other in directions orthogonal to the extending direction of the rod-shaped portion 300. Because of this, when it is desired to change the protruding length of the external terminal 22, for example, from the sealing resin 8, the second protrusions 321 and 322, which have been locked to the through hole of the printed circuit board 40, can be changed to the first protrusion 310 by merely rotating the external terminal 22 without applying excessive force.

Furthermore, in Embodiment 1, the outermost diameter/dimension of the second protrusions 321 and 322 of each of the external terminals 21, 22, 23, and 51 is larger than the outermost diameter/dimension of the first protrusion 310. Because of this, when the external terminal 21 is inserted into the through hole of the printed circuit board 40, for example, the external terminal 21 is securely locked to the through hole by the second protrusions 321 and 322 so that the end portion of the external terminal 21 will not apply unnecessarily large force to the electrode portion 131 of the insulating circuit substrate 1.

Embodiment 2

Figure 8:
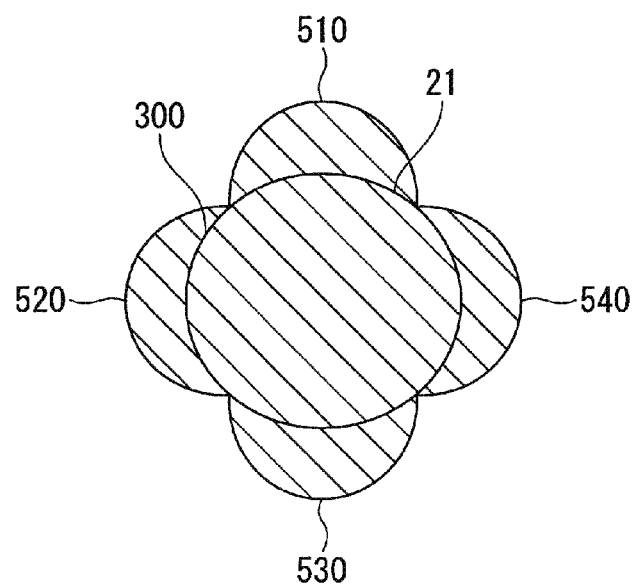
FIG. 8 shows a cross section of an external terminal according to Embodiment 2 of the present invention.

FIG. 8 is a diagram showing a cross-sectional shape of an external terminal according to Embodiment 2 of the present invention. In FIG. 8, the external terminal 21 will be described as a representative, and the same parts as those in FIGS. 2 and 3 are designated by the same reference numerals/characters, and detailed descriptions thereof will be omitted.

In FIG. 8, in the external terminal 21, the second protrusions 510, 520, 530, and 540 have an overall crisscross shape in a cross section taken along directions orthogonal to the extending direction of the rod-shaped portion 300 (corresponding to the Z-axis direction in FIG. 2).

Therefore, in Embodiment 2, since the second protrusions 510, 520, 530, and 540 of the external terminal 21 have a crisscross-shaped cross section, the external terminal 21 is securely locked to the through hole of the substrate 40 via the second protrusions 510, 520, 530, and 540.

In Embodiment 2, the cross section of the first protrusion 310 of the external terminal 51 may also be formed in a crisscross shape in a cross sections taken along directions orthogonal to the extending direction of the rod portion 300. In such a case, the external terminal 51 can also be securely locked to the through hole of the printed circuit board 40 via the first protrusion 310.

Figures 10A, 10B, 10C, 10D:
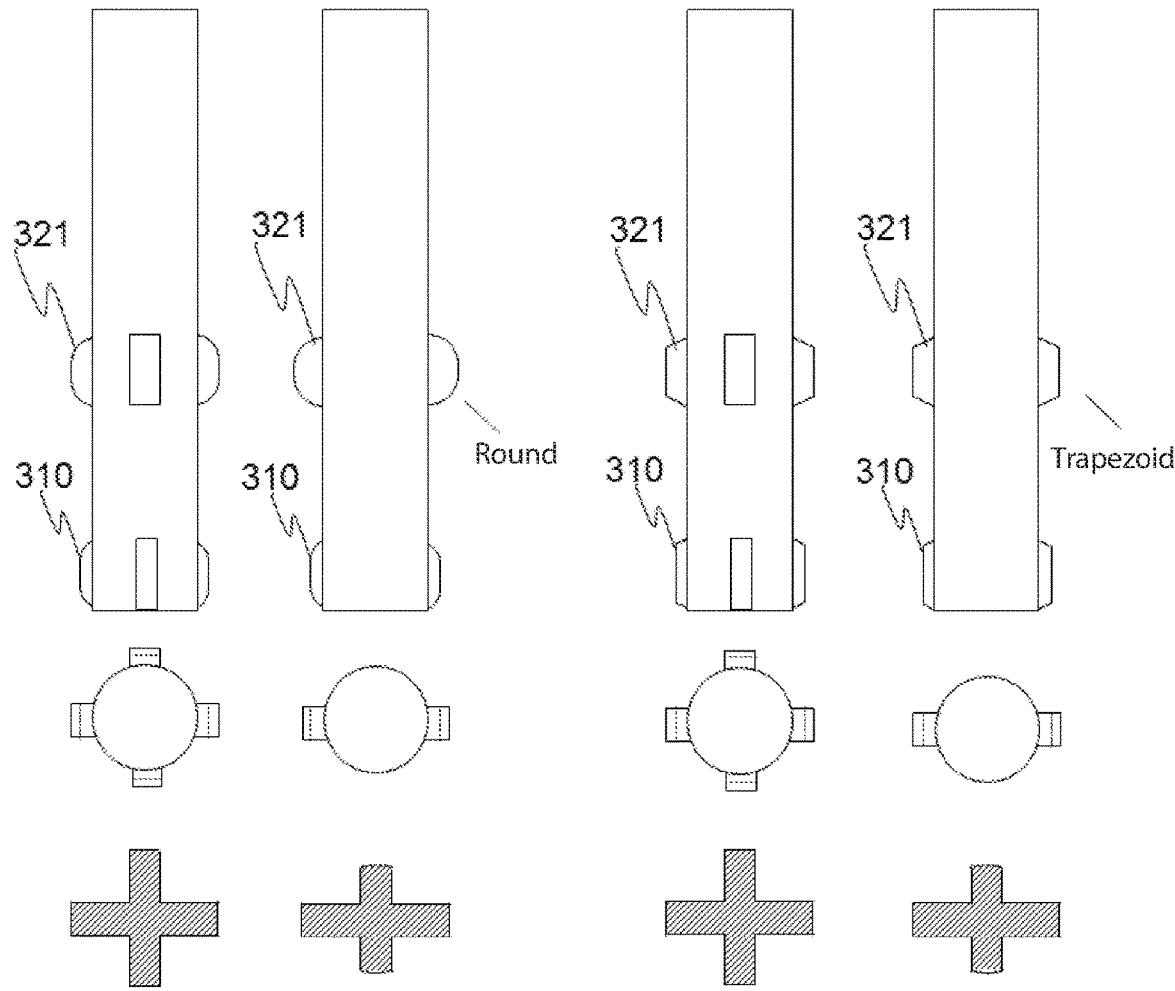
FIGS. 10A to 10D respectively show details of examples of the external terminal according to Embodiments 1 and 2.

FIGS. 10A to 10D respectively show details of examples of the external terminal according to Embodiments 1 and 2. In each of FIGS. 10A to 10D, the top drawing depicts a side view, the middle drawing depicts a top view with solid lines and dashed lines indicating the outermost shapes of the second and first protrusions, respectively, and the bottom drawing depicts a cross section of the second protrusion 321. As shown in these drawings, the cross-sectional shape of the protrusions 310 and 321 may have a crisscross shape (or a generally single line shape) extending horizontally. As shown in FIGS. 10A to 10D, the outermost dimension of the second protrusion is greater than the outermost dimension of the first protrusion. Also, the sideview shape of the protrusions may be round, as shown in FIGS. 10A and 10B or trapezoid as shown in FIGS. 10C and 10D. These first and second protrusions may be formed, for example, by using a copper wire member as a starting material and by sandwiching the wire member by a pair of dies so that the cross section of the protrusion has recesses as shown in the bottom figure of FIGS. 10A to 10D. Alternatively, they may be formed by pressing a square pole at portions that are not first or second protrusions. The material may be oxygen-free copper such as C1020 or C1100 copper. Aluminum (Al) may also be used when appropriate. Although FIGS. 10A to 10D show examples of the first protrusion being oriented horizontally in the same way as the second protrusion, they may protrude horizontally in different directions like being rotated by 90 degrees, for example, as described with reference to Embodiment 1 above. Further, any of the horizontal or sideview shapes of the first and second protrusions 310 and 321 in these drawings may be combined so that the first protrusion have a different overall shape from the second protrusion, for example.

Embodiment 3

Figure 9:
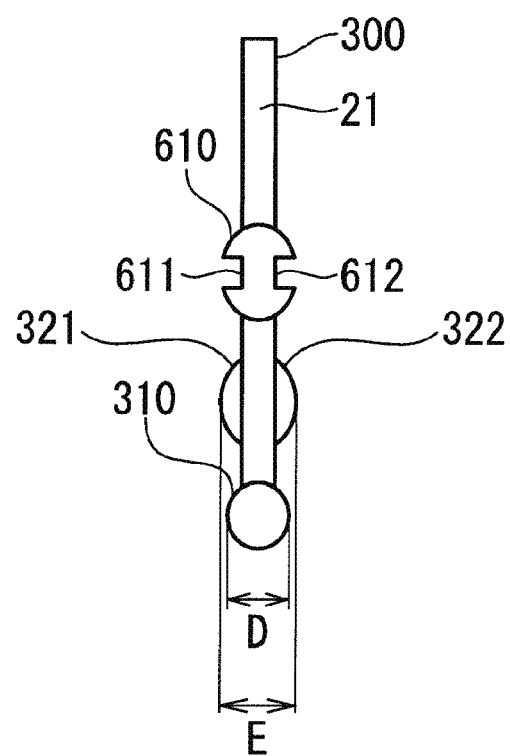
FIG. 9 shows the shape of an external terminal according to Embodiment 3 of the present invention.

FIG. 9 is a diagram showing the shape of an external terminal according to Embodiment 3 of the present invention. In FIG. 9, the external terminal 21 will be described as a representative, and the same portions as those in FIGS. 2 and 3 are assigned the same reference numerals/characters, and their explanations are omitted.

In FIG. 9, the external terminal 21 has a recess 610 for locking the sealing resin 8 at a position above the second protrusions 321 and 322 of the rod-shaped portion 300. The recess 610 forms locking portions 611 and 612 in directions orthogonal to the extending direction of the rod-shaped portion 300.

Also in the external terminal 51, a recess 610 for locking the sealing resin 8 may be formed at a position above the second protrusions 321 and 322 of the rod-shaped portion 300.

With this configuration, the sealing resin 8 can be positioned with respect to the external terminal 21 and the external terminal 51 with high accuracy, thereby stabilizing the sealing resin 8.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

For example, in the above-described Embodiment 1, an example has been described in which the outermost diameter/dimension of the second protrusions 321 and 322 is made larger than the outermost diameter/dimension of the first protrusion 310. However, the present invention is not limited thereto. The outermost diameter/dimension of the first protrusion 310 may be larger than the outermost diameter/dimension of the second protrusions 321, 322, or may be the same.

In addition, in Embodiment 1, the printed circuit board 40 is configured to have the insulating layer 401, the circuit layer 402 on the front surface of the insulating layer 401, and the circuit layer 403 on the back surface of the insulating layer 401. The present invention is not limited thereto. The printed circuit board 40 may only have the insulating layer 401 and the circuit layer 402 on the front surface of the insulating layer 401.

In addition, in Embodiment 2, the second protrusions 510, 520, 530, and 540 have been described as an example. However, the present invention is not limited to this, and both the first protrusion and the second protrusions may have a crisscross-shaped cross section taken along directions orthogonal to the extending direction of the rod-shaped portion 300.

Although the semiconductor chips 2 and 3 are IGBTs or MOSFETs in each of the above embodiments, the gate insulating film of the semiconductor chips 2 and 3 is not limited to a silicon oxide film ($SiO_2$ film), and may be another insulating film. The MOSFET using an insulating film other than the $SiO_2$ film may be referred to as a MIS (metal insulator semiconductor) FET. MISFET means a more comprehensive insulated gate transistor, including MOSFET.

What is claimed is:

1. A power semiconductor module, comprising:
an insulating circuit substrate having a conductive plate that mounts a semiconductor chip thereon;
a printed circuit board having a plurality of through-holes, the printed circuit being placed above the insulating circuit substrate so as to face a surface of the insulating circuit substrate on which the semiconductor chip is mounted;
a plurality of terminals, each of the plurality of terminals having a rod-shaped portion, and including a first protrusion and a second protrusion each protruding laterally form a side face of the rod-shaped portion, the first protrusion being positioned closer to an end of the terminal than the second protrusion; and
a sealing part sealing the insulating circuit substrate, the printed circuit board, and the plurality of terminals,
wherein at least one of the plurality of terminals is inserted to one of the through-holes of the printed circuit board and is locked to the one of the through-holes via the first protrusion, and
wherein at least another one of the plurality of terminals is inserted to another one of the through-holes of the printed circuit board and is locked to said another one of the through-holes via the second protrusion, and the end of the at least another one of the plurality of terminals is electrically connected to the conductive plate on the insulating circuit substrate.

2. The power semiconductor module according to claim 1, wherein in each of the plurality of terminals, the first and second protrusions protrude laterally from the side face in mutually different directions.

3. The power semiconductor module according to claim 1, wherein an outermost dimension of the second protrusion is greater than an outermost dimension of the first protrusion.

4. The power semiconductor module according to claim 1, wherein in each of the plurality of terminals, at least one of the first and second protrusions has more than one protruding parts in a cross section taken along a plane perpendicular to an elongated direction of the rod-shaped part of the terminal.

5. The power semiconductor module according to claim 4, wherein in each of the plurality of terminals, said at least one of the first and second protrusions has a crisscross shape in the cross-sectional view taken along the plane perpendicular to the elongated direction of the rod-shaped part of the terminal.

6. The power semiconductor module according to claim 1, wherein each of said one of the plurality of terminals and said another one of the plurality of terminals has a recess to engage with the sealing part.

7. The power semiconductor module according to claim 1,
wherein the printed circuit board includes an insulating layer, a circuit layer formed on a front surface of the insulating layer, and another circuit layer formed on a rear surface of the insulating layer,
wherein each of the plurality of through-holes penetrates through the circuit layer, the insulating layer, and the another circuit layer, and an inner face of the through-hole is formed of a conductive material that electrically connect the circuit layer and the another circuit layer.

8. A power semiconductor module, comprising:
an insulating circuit substrate having a conductive plate that mounts a semiconductor chip thereon;
a printed circuit board having a plurality of through-holes, the printed circuit being placed above the insulating circuit substrate so as to face a surface of the insulating circuit substrate on which the semiconductor chip is mounted;
a plurality of terminals, each of the plurality of terminals having a rod-shaped portion, and including a first protrusion and a second protrusion each protruding laterally form a side face of the rod-shaped portion, the first protrusion being positioned closer to a bottom end of the terminal than the second protrusion; and
a sealing part sealing the insulating circuit substrate, the printed circuit board, and the plurality of terminals,
wherein at least one of the plurality of terminals is inserted to one of the through-holes of the printed circuit board and is locked to the one of the through-holes by press-fitting and locking the first protrusion to the one of the through-holes, and
wherein at least another one of the plurality of terminals is inserted to another one of the through-holes of the printed circuit board and is locked to said another one of the through-holes by press-fitting and locking the second protrusion to said another one of the through-holes, and the bottom end of the at least another one of the plurality of terminals is electrically connected to the conductive plate on the insulating circuit substrate.

* * * * *